United States Patent [19]

Matsumoto et al.

[11] Patent Number: 4,959,529
[45] Date of Patent: Sep. 25, 1990

[54] SHEET HEATING DEVICE

[75] Inventors: Yumio Matsumoto, Kasugai; Yasuo Kimura, Ichinomiya; Osamu Takagi; Takatoshi Takemoto, both of Nagoya, all of Japan

[73] Assignee: Brother Kogyo Kabushiki Kaisha, Japan

[21] Appl. No.: 425,940

[22] Filed: Oct. 24, 1989

[30] Foreign Application Priority Data

| Oct. 31, 1988 | [JP] | Japan | 63-142147[U] |
| Oct. 31, 1988 | [JP] | Japan | 63-142148[U] |
| Oct. 31, 1988 | [JP] | Japan | 63-142153[U] |
| Jan. 27, 1989 | [JP] | Japan | 1-8871[U] |
| Jan. 27, 1989 | [JP] | Japan | 1-8872[U] |

[51] Int. Cl.$^5$ ............................................. G03G 15/20
[52] U.S. Cl. ................................... 219/388; 219/216; 355/291
[58] Field of Search ............... 219/216, 388, 400; 355/291, 286, 287, 288, 289, 290

[56] References Cited

U.S. PATENT DOCUMENTS

| 3,440,944 | 4/1969 | Endermann | 219/216 |
| 3,498,592 | 3/1970 | Moser | 219/216 |
| 4,092,658 | 5/1978 | Schröter | 219/216 |
| 4,384,783 | 5/1983 | Sakata | 219/216 |

Primary Examiner—Teresa J. Walberg
Attorney, Agent, or Firm—Oliff & Berridge

[57] ABSTRACT

A sheet heating device having heat insulators for preventing at least one of sheet feeding roller and sheet discharge roller from being overheated. The sheet heating device includes a delivery unit for delivering a piece of sheet, a heating unit for heating the sheet on a delivery path of the sheet, a cover member for covering the heating unit and opening on a feed side and a discharge side of the sheet, respectively, and two pairs of rollers adapted to close respective openings of the cover member. The pair of rollers serve as heat insulators for avoiding overheating to the sheet feeding and discharging rollers. Shutter members are also available for heat insulation. The shutter members also serve to confine hot air within an interior of the heating device.

18 Claims, 8 Drawing Sheets

SHEET HEATING DEVICE

BACKGROUND OF THE INVENTION

The present invention relates to a sheet heating device in which a sheet is delivered while being heated by a heater disposed in a sheet feed path. More particularly, the invention relates to a sheet heating device suitable for a copying machine.

In general, in various copying machines, in the case where an image formed of thermally molten substances is formed on a piece of sheet such as paper, the sheet is clamped between paper feed rollers and is fed onto a delivery means. In a convection type heating means, air heated by a heater is recirculated and impinged onto the sheet, or in a radiation type heating means, the sheet is heated by radiation heat of the heater. Thereafter, the sheet is clamped and discharged by discharge rollers However, in the conventional sheet heating device, during heating of the sheet, heated air would be leaked from a cover to heat the paper feed/discharge rollers and the paper feed/discharge rollers would be heated by the radiation heat of the heater. As a result, the sheet would be rapidly heated on the paper feed side. In this case, the thermally molten substances forming the image are boiled to form bubbles, thereby degrading a quality of the image. On the other hand, thermally molten substances are molten by the heat of the discharge rollers and would be adhered to the discharge rollers, thereby forming image damages such as flow and breakdown to deteriorate quality of the image.

Also, in a conventional copying machine, in the case where a latent image formed in a photosensitive-pressure sensitive sheet is transferred to a developer paper to form a visible image, after the sensitive sheet and the developer paper have been overlapped with each other under a pressure, only the developer paper is fed to a heating device. In the heating device, the image is thermally fixed by the operation of a heater and a fan within the heating device.

However, in the heating device, since an inlet into which the developer paper is fed and an outlet from which the developer paper is discharged are always open, the leakage amount of the heated air is increased, so that a heat loss is increased and it takes long time to perform the heating treatment. Also, it is necessary to increase the capacity of the heater, which leads to an increase of the manufacture cost. Also, other instruments located around the heating device are excessively heated. Thus, the conventional heating device suffers from various disadvantages.

SUMMARY OF THE INVENTION

In order to overcome the above-noted defects, an object of the invention is to provide a sheet heating device for preventing the heating of paper feed rollers for clamping and feeding a piece of sheet, thereby preventing the generation of bubbles due to the boiling of the thermally molten substances and ensuring the high quality of the image.

Another object of the invention is to provide a sheet heating device that is capable of preventing a temperature increase of the discharge rollers for clamping and discharging a piece of sheet, whereby the adhesion of the sheet to the discharge rollers due to the melting of the thermally molten substances is prevented, to thereby ensure a high quality image without any image defects such as damage and breakdown.

Still another object of the invention is to provide a sheet heating device in which a paper jam would hardly be generated.

Still another object of the invention is to provide a sheet heating device in which any winding of the sheet around the discharge rollers due to the melting of the thermally molten substances is prevented to thereby ensure the high quality of the image.

Still another object of the invention is to provide a sheet heating device in which any winding of the sheet around the discharge rollers due to the melting of the thermally molten substances is prevented to thereby ensure the high quality of the image.

Still another object of the invention is to provide a sheet heating device in which a heat loss is reduced to effectively perform the heat treatment, and in which a fear that instruments located around the heating device are free from the problem of excessive heating.

In order to attain these and other objects, according to the invention, there is provided a sheet heating device comprising: a guide plate on which a sheet travels, the guide plate having upstream and downstream ends, a sheet feeding means provided at the upstream end of the guide plate for feeding the sheet onto the guide plate, a sheet discharge means provided at the downstream end of the guide plate for discharging the sheet therefrom, heating means for heating the sheet on the guide plate, and at least one heat insulating member provided at one of a position between the heating means and the sheet heating means and a position between the heating means and the sheet discharge means for preventing a temperature increase of one of the sheet feeding means and the sheet discharge means.

According to another aspect of the invention, there is provided a sheet heating device comprising a delivery means for delivering a piece of sheet, a heating means for heating the sheet on a delivery path of the sheet, a cover member for covering the heating means and opening on a feed side and a discharge side of the sheet, respectively, a pair of shutter members for opening/closing respective openings of the cover member and a drive means for driving the shutter members to an open side when a leading end portion of the sheet approaches the respective shutter members, and for driving the shutter members to a closed side when a trailing end portion of the sheet approaches the respective shutter members.

According to still another object of the invention, there is provided a sheet heating device comprising: a delivery means for delivering a piece of sheet, said delivery means including a first delivery means located on an up stream side and a second delivery means located on a downstream side for defining a delivery path of said sheet, a heating means for heating the sheet on said delivery path, a heat insulating means for preventing a temperature increase of said delivery means due to heat of said heating means, and a covering means for substantially hermetically covering said heating means in cooperation with said heat insulating means.

DESCRIPTION OF THE PREFERRED EMBODIMENTS

Figure 1:
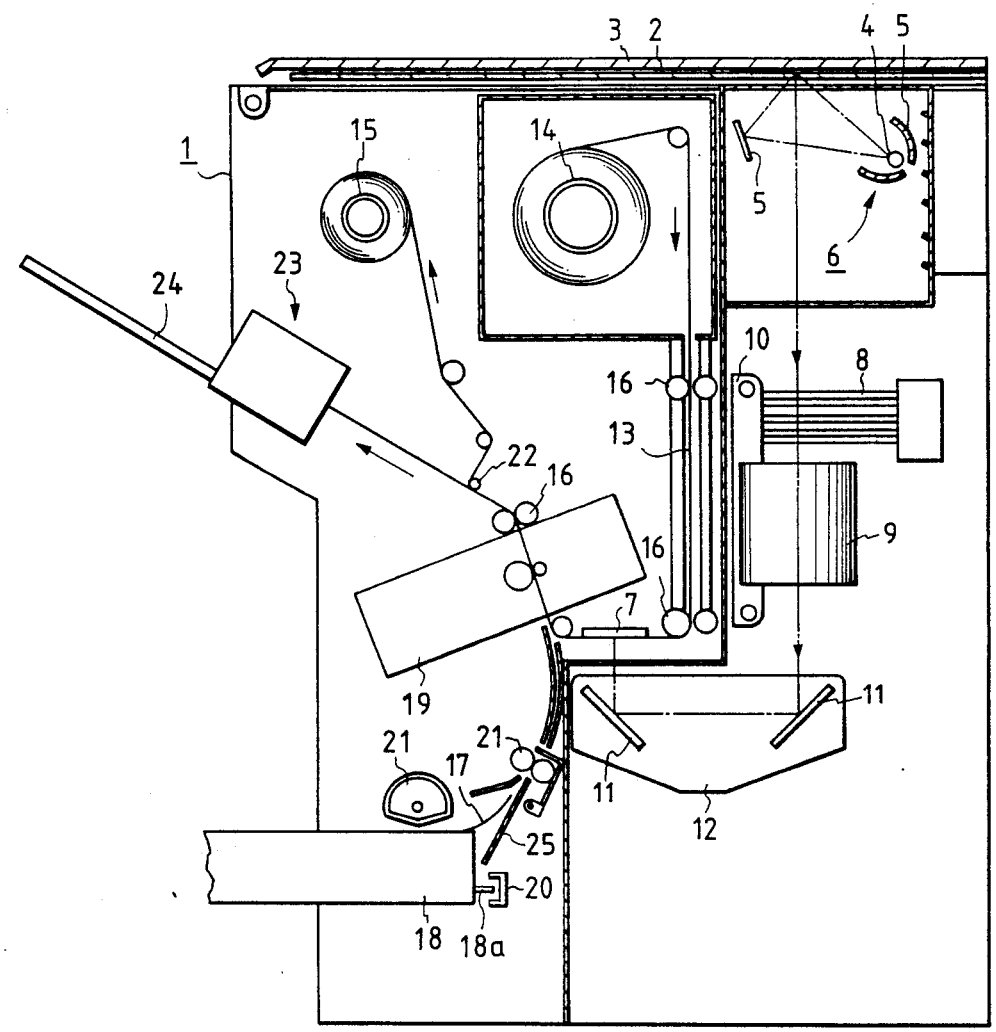
FIG. 1 is a cross-sectional view showing an entire copying machine having a sheet heating device.

A color copying machine in accordance with an embodiment of the invention will now be described with reference to FIGS. 1 to 6.

As shown in Fig. I, on a top portion of a copying machine 1, there are provided an original plate glass 2 on which an original is to be laid, and a cover 3 movable rightwardly and leftwardly for opening/closing the original base glass 2. Under the original base glass 2, there is provided a light source 6 that is composed of a halogen lamp 4 extending in a direction perpendicular to the direction of movement of the original base glass 2 and irradiating light onto the original on the original base glass 2 and a reflector mirror 5 for reflecting the light of the halogen lamp 4 toward the original base glass 2. During the irradiation of the light source 6, the original base glass 2 is moved rightwardly and leftwardly, thereby the original as a whole is irradiated.

On the other hand, an exposure base 7 is provided substantially in the middle portion of the copying machine 1. A set of filters 8 for adjusting a tone of the copied image and a condenser lens 9 are interposed between the light source 6 and the exposure base 7 and are supported by a mounting plate 10. A pair of reflecting mirrors 11 adjusting an optical path length and a focus are pivotally supported in a positionally adjustable fashion by a mounting plate 12 between the condenser lens 9 and the exposure base 7. After the light has been projected onto the original, the light reflected from the original is led to the exposure base 7 past the filters 8, the condenser lens 9 and the reflecting mirrors 11.

In an inner upper portion of the copying machine 1, a cartridge 14 is detachably encased, and a takeup shaft 15 is rotatably supported in place. An elongated microcapsule paper 13 that carries a number of microcapsules encapsulating dye for color copying is encased in the form of a roll in the cartridge 14. After the microcapsule paper 13 has been drawn from the cartridge 14 by the rotation of a plurality of feed rollers 16, the paper is wound around the takeup shaft 15, whereupon a part of the paper traveling along the lower surface of the exposure base 7 is exposed to thereby form a latent image of the original.

Below the exposure base 7 is a cassette 18 encasing a number of pieces of developer paper sheet 17, each sheet 17 each having a constant size. The cassette 18 is detachably mounted in the copying machine 1. A pressure development unit 19 is interposed between the exposure base 7 and the takeup shaft 15. With such an arrangement, the exposure part of the microcapsule paper 13 and the developer paper 17 are brought into pressing contact with each other within the pressure development unit 19, so that a color image is formed on the developer paper 17 in accordance with the latent image on the microcapsule paper 13. Also, a projection 18a for detecting size of the developer paper 17 is provided on the cassette 18. In association with this, a judging means 20 for judging the size of the developer paper 17 in accordance with the size of the projection 18a is provided in the copying machine 1.

Between the cassette 18 and the pressure development unit 19, there are provided a plurality of feed rollers 21 for feeding the developer paper 17 toward the pressure development unit 19 and paper guides 25. On the paper discharge side of the pressure development unit 19, there is provided a peeling roller 22 for peeling the developer paper 17 away from the microcapsule paper 13. Downstream of the peeling rollers 22, a sheet heating unit 23 is provided for thermally fixing the image formed on the developer paper 17. The developer paper 17 discharged from the sheet heating unit 23 is received on a tray 24.

In operation for obtaining a color copy with the copying machine, when a start button (not shown) is depressed, the original base glass 2 is moved to a rightmost movement end, and the left end of the original is located to face the halogen lamp 4 of the light source 6. Thereafter, the halogen lamp 4 is turned on. Under this condition, the original base glass 2 is moved leftward back to the initial position, thereby completing the irradiation of the original by the light.

During the light-irradiation, the microcapsule paper 13 is moved on the exposure base 7 at the same speed as that of the original base glass 2. As a result, the latent image of the original is formed on the microcapsule paper 13 by the reflected light from the original. On the other hand, the developer paper 17 is moved from the cassette 18 toward the pressure development unit 19 in synchronism with the backward, leftward movement of the original base glass 2. The exposed part of the microcapsule paper 13 is brought into pressing contact with the developer paper 17, thereby forming a color image on the developer paper 17. Thereafter, the developer paper 17 is led into the sheet heating unit 23 by the feed rollers 16 and the like. The image is thermally fixed by an internal heat of the heating unit 23. Then, the developer paper 17 is discharged to the tray 24.

The above-described sheet heating unit 23 will now be described in greater detail with reference to FIGS. 2 to 6.

Figure 2:
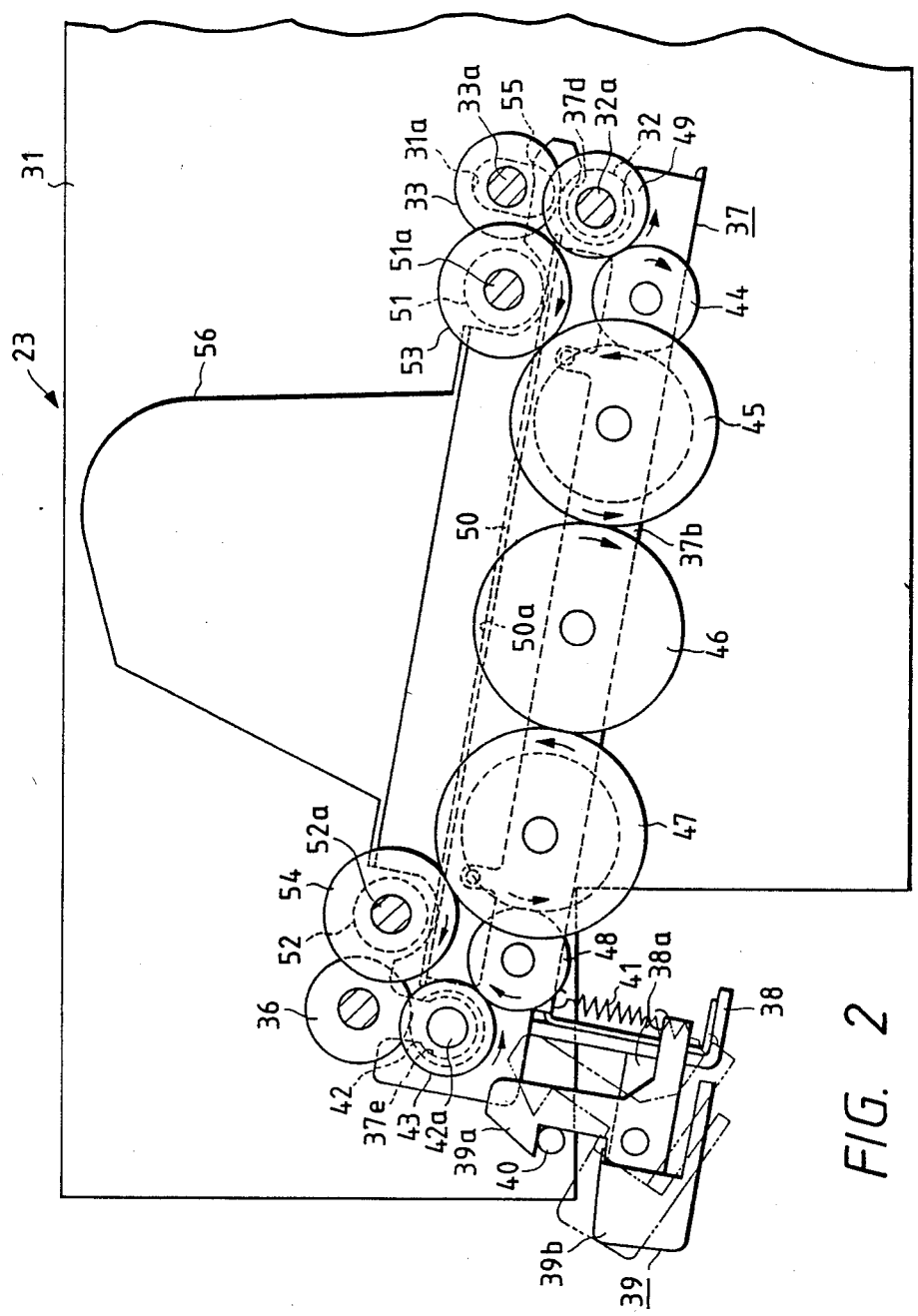
FIG. 2 is a sectional view showing a primary part of the sheet heating device in accordance with one embodiment of the invention.
Figure 3:
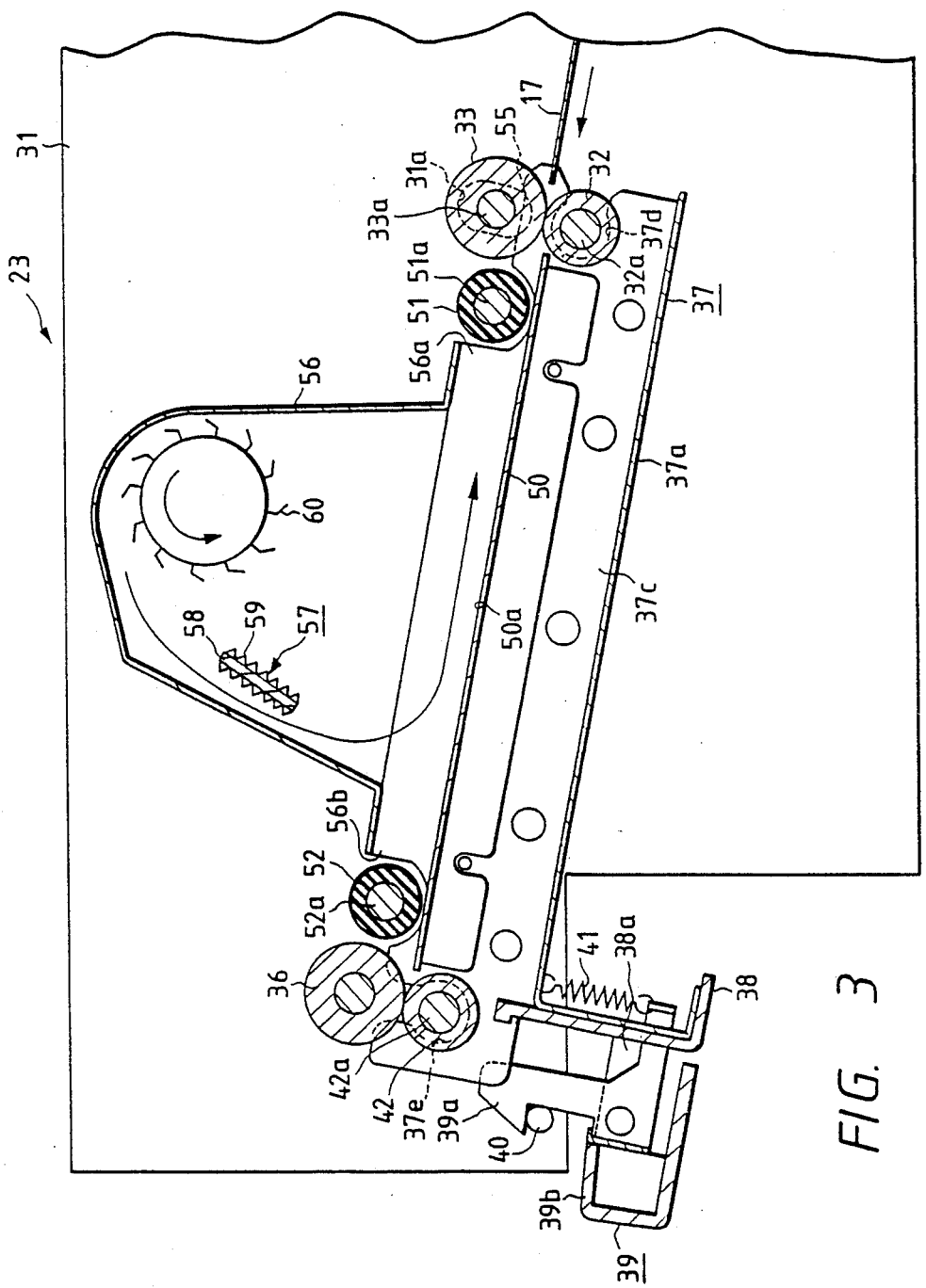
FIG. 3 is a sectional view showing a closed position of a guide plate shown in FIG. 2.
Figure 4:
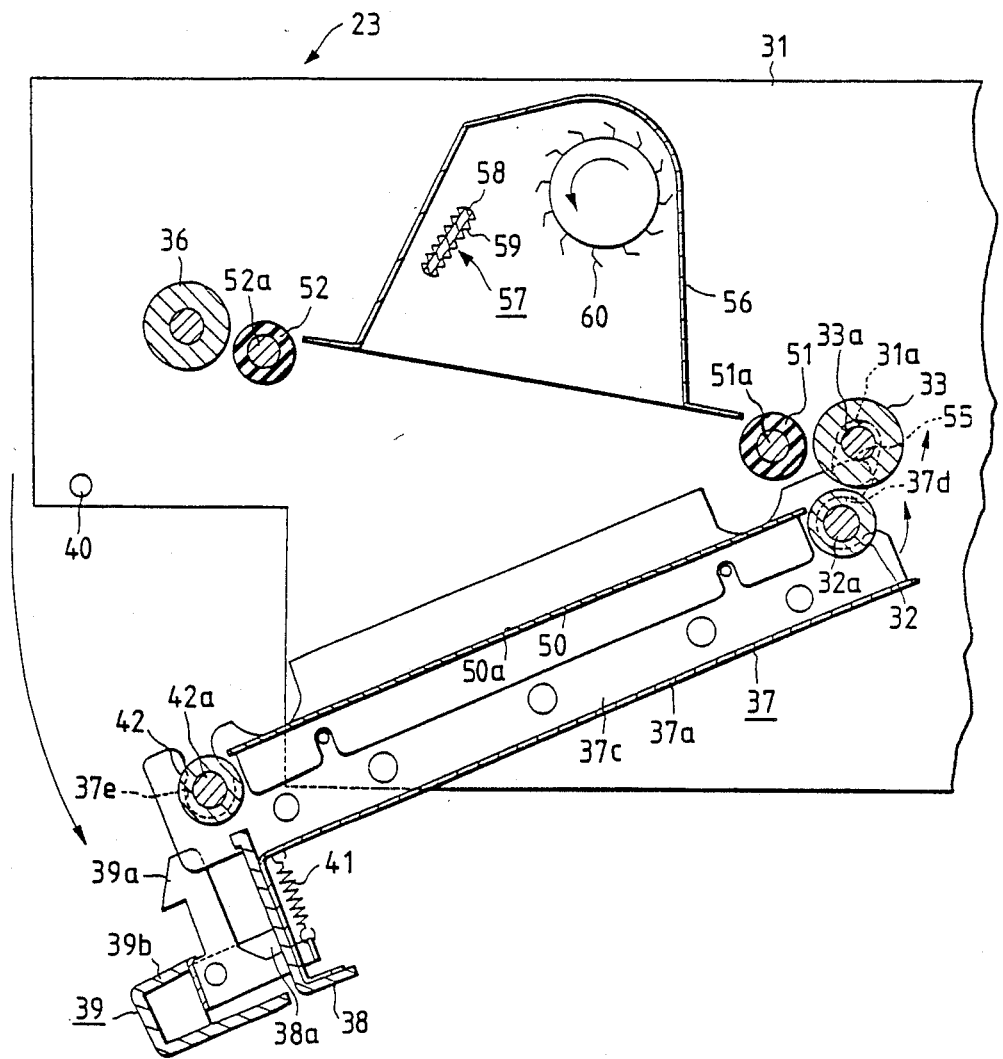
FIG. 4 is a sectional view showing an open position of the guide plate shown in FIG. 2.
Figure 5:
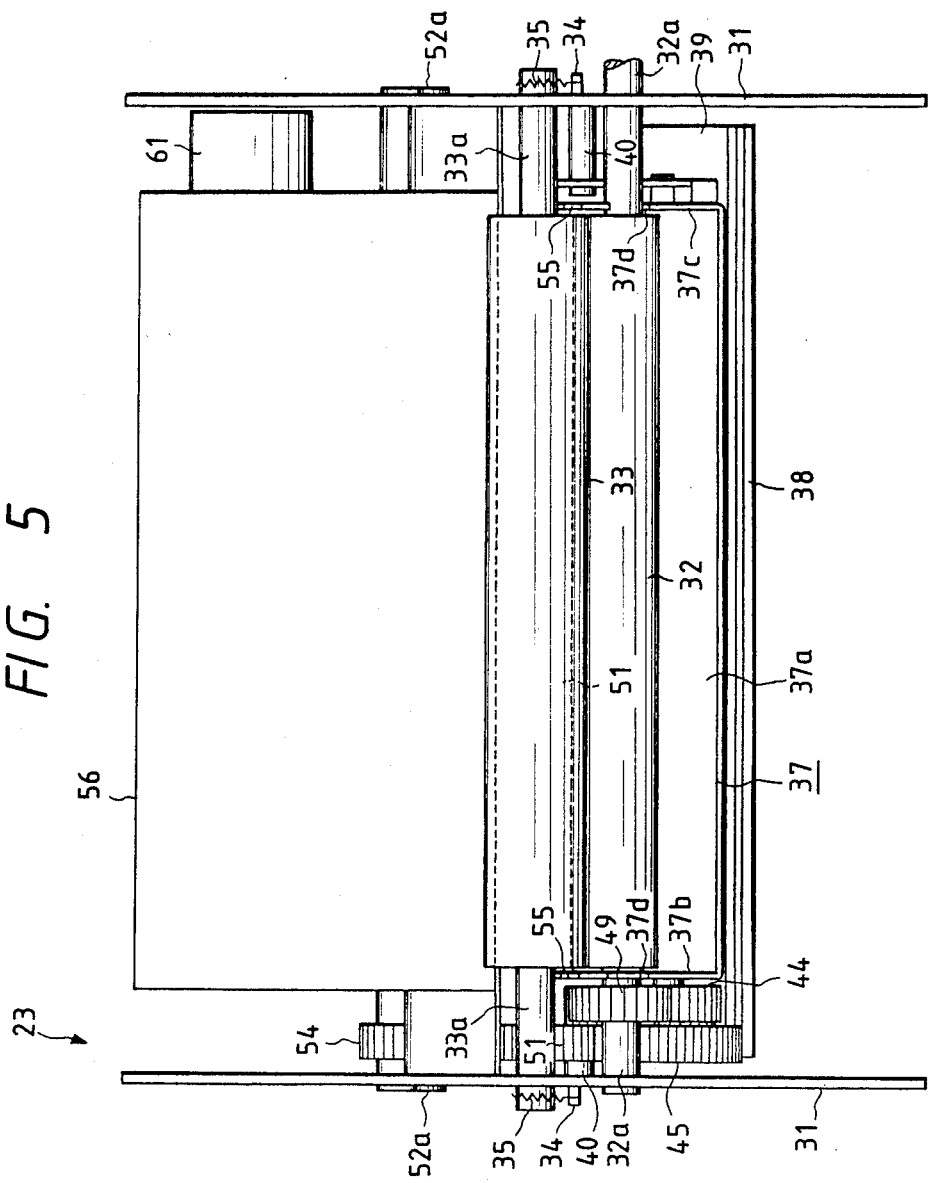
FIG. 5 is a side elevational view as viewed from the right of the copying machine.
Figure 6:
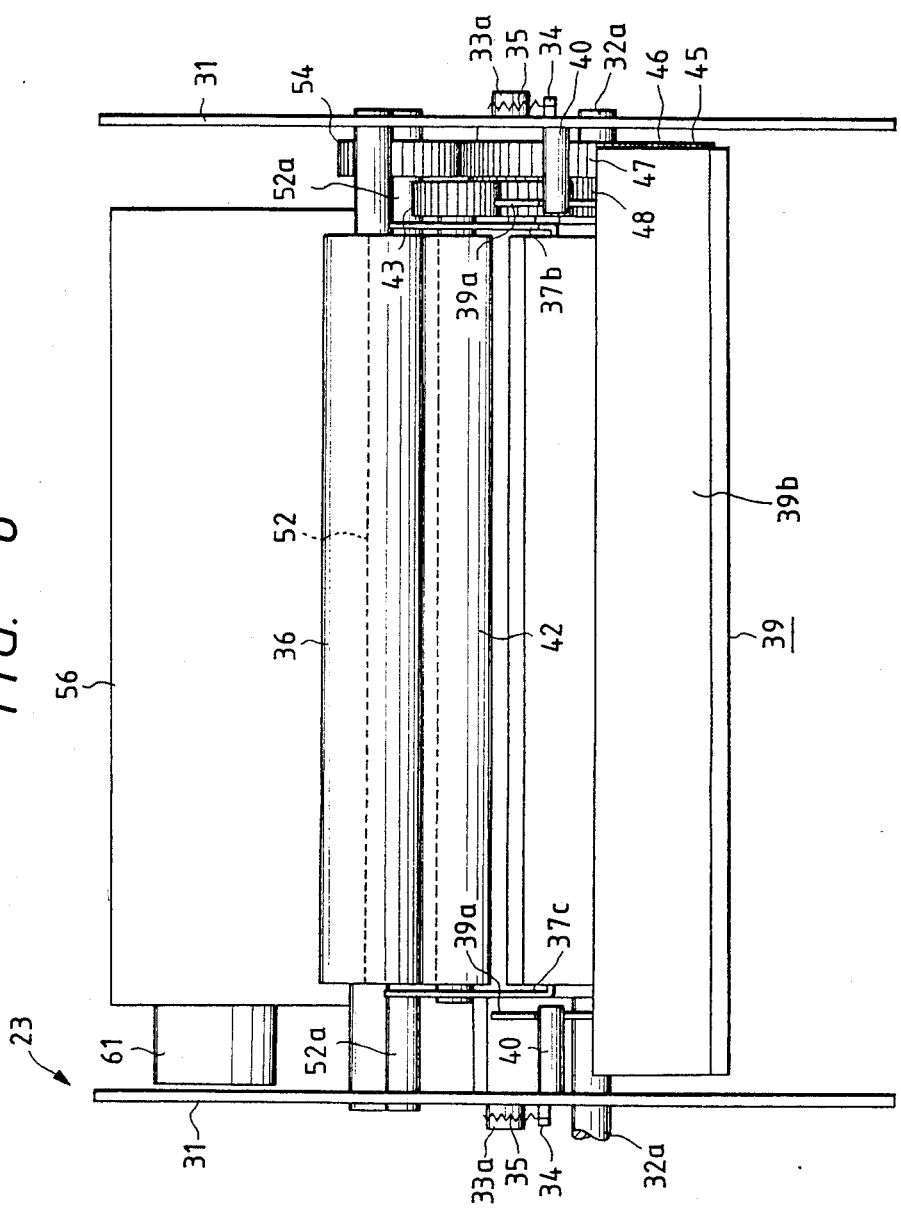
FIG. 6 is a side elevational view as viewed from the left of the copying machine.

As shown in FIGS. 2 to 4, a lower feed roller 32 is located on the feed side under the feed path and is rotatably supported between a pair of support plates 31 (see Fig. arranged to face each other at an interval. An associated upper roller 33 located above the feed path is rotatably supported between the spaced support plates 31 above the lower feed roller 32. A shaft 33a protruding from the opposite ends of the upper roller 33 is adapted to pass through elongated holes 31a formed in the support plates 31. As shown in FIGS. 5 and 6, a pair of retainer projections 34 are formed on outer surfaces of the respective support plates 31, and springs 35 laid at the projections 34 are laid around the shaft ends 33a. Accordingly, the upper paper feed roller 33 may be switched over between an operative position (FIG. 3) where the upper roller 33 normally comes into contact with the lower paper feed roller 32 by the gravitational force thereof and the spring biasing force of the spring 35 to thereby press the developer paper 17 therebetween and an inoperative position (FIG. 4) where the upper feed roller 33 is separated away from the lower feed roller 32 along the elongated hole 31a. When the upper feed roller 33 is located in the operative position, the upper feed roller 33 is rotated clockwise in accordance with the rotation of the paper feed roller 32 to thereby feed the developer paper 17 in cooperation with the paper feed roller 32.

An upper paper discharge roller 36 is rotatably supported between the support plates 31 on the discharge side of the paper feed path.

A guide plate 37 having a bottom plate 37a and a pair of side plates 37b and 37c each extending upwardly from the side edge of the bottom plate 37a is provided between the support plates 31. Bearing holes 37d formed in the end portion, on the paper feed side, of both the side plates 37b and 37c are engaged with the shaft ends 32a of the paper feed roller 32, so that the guide plate 37 is rotatable about the shaft ends 32a between two positions, that is, a closed position for feeding the developer paper as shown in FIG. 3, and an open position for stopping the feed of the developer paper 17 as shown in FIG. 4. Also, at the discharge end portion of the bottom plate 37a of the guide plate 37, there is formed a suspension portion 38. A lock lever 39 having a pair of claw portions 39a and an operating portion 39b is rotatably provided between bearings 38a (one of which is shown) formed at both ends of the suspension portion 38. The guide plate 37 is held at the closed position shown in FIG. 3, by the engagement between the claw portions 39a and retainer pins 40 projecting from inner surfaces of both the support plates 31.

Also, a spring 41 for normally biasing the lock lever 39 in the engagement direction (in the clockwise direction) is interposed between the lock lever 39 and the bottom 37a. The lock lever 39 is rotated against the biasing force of the spring 41 from the position indicated by the solid line to the position indicated by the two-dot and dash line in FIG. 2, whereby the retention of the guide plate 37 is disabled.

A lower paper discharge roller 42 that has the same diameter as that of the lower paper feed roller 32 is rotatably supported in bearing holes 37e formed in the discharge end portions of the opposite side plates 37b and 37c, which bearing holes 37e are open upwardly. When the guide plate 37 is in the closed position, the lower paper discharge roller 42 is brought into contact with the upper paper discharge roller 36 and is in the operative position (FIG. 2) for pressingly clamping the developer paper 17. On the other hand, when the guide plate is in the open position, the lower discharge roller 42 is switched over to the inoperative position (FIG. 4) where the roller 42 is separated away from the upper discharge roller 36. As shown in FIGS. 2 and 6, the discharge roller 42 is provided with a gear 43 at one end portion of the shaft 42a, and is drivingly connected to a gear 49, provided at the outer end portion of the shaft end 32a, through gears 44 to 48 rotatably supported on the outside of the side plate 37b of the guide plate 37. In accordance with the rotation of a motor (not shown), the paper feed roller 32 and the paper discharge roller 42 are rotated counterclockwise through the gear train 44 to 48.

Also, the lower paper discharge roller 42 is located in the operative position where the roller 42 comes into contact with the upper paper discharge roller 36, so that the upper paper discharge roller 36 is rotated clockwise in accordance with the rotation of the lower paper discharge roller 42. A ferrous guide plate 50 having a sheet surface 50a is provided between the paper feed roller 32 and the paper discharge roller 42. Thus, the developer paper 17 is fed along and on the sheet feeding surface 50a of the guide plate 50 in accordance with the rotations of the respective rollers 32, 33, 36 and 42. It should be noted that, in this embodiment, the feeding means is composed of of the shaft end 32a, through gears 44 to 48 rotatably the above-described paper feed rolelrs 32 and 33 and the guide plate 50.

Also, teh numbers of teeth of the gears 44 and 48 are set at the same, and the numbers of teeth of the gear 45 to 47 are set at the same. In addition, the number of teeth of the gear 43 is about 10% larger than teh number of teeth of the gear 49. Furthermore, a diameter of the paper discharge roller 42 is equal to a diameter of the paper feed roller 32. Accordingly, a peripheral speed of the paper discharge roller 42 is higher than peripheral speed of the paper feed roller 32. As a result, a suitable tension is applied to the developer paper 17 during the travel of the paper by the respective rollers 32, 33, 42 and 36.

An arcuate engagement projection 55 is formed as an operating member on an upper surface of the feed side end portion of each side plate 37b, 37c of the guide plate 37 on the feeding side of the feed path. When the guide plate 37 is located in the open position as shown in FIG. 4, the engagement projection 55 is engaged with the shaft 33a of the paper feed roller 33 to thereby lift the shaft 33a along the elongated hole 31a. Thus, the upper paper feed roller 33 is switched over to the inoperative position away from the paper feed roller 32.

A cover 56 having an inlet 56a and an outlet 56b at both ends and covering the upper portion of the guide plate 50 is disposed above the guide plate 50. A heater 57 is arranged on the discharge side within the cover 56. The heater 57 is composed of an insulating substrate 58 made of insulating material and extending over an entire region of the developer paper 17 in the transverse direction, and a coil heater 59 wound around the substrate 58, so that air around the heater 57 is heated when current is applied to the coil heater 59.

A blower fan 60 is provided on the feed side within the cover 56 and is rotatable about an axis transverse to the direction of movement of the developer paper 17. The blower fan 60 is rotated in the counterclockwise direction (FIG. 3) by a motor 61 (FIGS. 5 and 6). In this embodiment, the heating means is composed of the heater 57 and the blower fan 60, whereby heated air flow is formed in the direction indicated by the arrow along the surface of the developer paper 17 over the entire transverse region of the feed path.

Insulating rollers 51 and 52 made of silicone rubber and disposed close to the paper feed roller 33 and the paper discharge roller 36, respectively, are rotatably supported between the support plates 31 above the guide plate 50. As shown in FIG. 3, a distance between the guide plate 50 and each of the insulating rollers 51 and 52 is slightly larger than a thickness of the developer paper 17 (by about 1 to 2 mm in this embodiment), so that each of the insulating rollers 51 and 52 is used for preventing a temperature increase of the feed rollers 32 and 33 and the discharge rollers 36 and 42 due to the heat of the heating means as described later. Also, as shown in FIG. 2, the insulating rollers 51 and 52 are rotated clockwise by the engagement between the gears 53 and 54 provided at the outer end portions of the shafts 51a and 52a and the above-described gears 45 and 47. The peripheral speed of the insulating rollers 51 and 52 is set at the same as that of the paper feed roller 32, that is, the feed speed of the developer paper 17.

Under the condition that the heated air flow is formed, when the paper feed roller 32 and the paper discharge roller 42 are drivingly rotated, the rotation of the feed rollers 32 and 33 causes the developer paper 17 to move from the inlet 56a into the cover 56. Thereafter, the rotation of the discharge roller 42 and the discharge roller 36 causes the developer paper 17 to move out of the outlet 56b During this movement of the developer paper 17, the latter is heated by the heated air flow, so that the image is thermally fixed on the developer paper 17. Also, in cooperation with the feed roller 32 and the discharge roller 42, the insulating rollers 51 and 52 are rotated clockwise at the same peripheral speed as the feed speed of the developer paper 17 along the feed direction thereof Even if the insulating roller 51 would be brought into contact with the image forming surface of the developer paper 17 by the rotation of the insulating rollers 51 and 52, there is no fear that a scratch flow or damage would be formed Also, in the heating unit 23 in the foregoing embodiment, the insulating roller 51 (or 52) is provided in the vicinity of the inlet 56a (or outlet 56b) of the cover 56, and the distance between the roller 51 (or 52) and the guide plate 50 is slightly larger than the thickness of the developer paper 17. Accordingly, it is possible to reduce a leakage of the heated air flow from the inlet 56a (or 56b) and to prevent the temperature increase of the paper feed rollers 32 and 33 (36 and 42). As a result, it is possible to prevent the formation of bubbles that would be formed by boiling of thermally molten substances due to the rapid heating of the developer paper 17 on the paper feed side. It is thus possible to obtain a high quality image without image faults such as a flow or a breakdown.

Also, in the embodiment, since the insulating roller 51 (or 52) is made of insulating silicone, it is possible to prevent the developer paper 17 from adhering to the roller 51 (or 52).

Although the invention is applied to the color copying machine in the embodiment, it is apparent that the invention may be applied to a monochromatic copying machine.

As described above, it is possible to prevent the heating of the paper feed discharge rollers for clamping and feeding the paper and to prevent the formation of the bubbles due to the boiling of the thermally molten substances, thus obtaining without image faults such as flows and breakdown.

In particular, it is preferable that the heat insulating roller 52 located on the paper discharge side is made of foamed material of silicone rubber and its hardness is at 15 degrees in terms of rubber hardness. If the insulating roller 52 on the discharge side is made of foamed material of silicone rubber, a surface of the developer paper 17 would hardly be damaged due to the soft surface of the sponge-like roller 52. In particular in the case where an overhead projector film is used as the developer paper 17 or a shiny mode is adapted, the advantage of the foamed roller 52 is remarkable.

Also, a modification of the foregoing embodiment will now be described in order to prevent generation of a paper jam. In the modification, a distance between the paper feed roller 51 and the guide plate 50 is slightly, i.e., about 1 mm larger than the thickness of the developer paper 17, whereas a distance between the discharge roller 52 and the guide plate 50 is about 2 mm larger than the thickness of the developer paper 17. Accordingly, the paper jam may be prevented as well as the temperature increase of the feed rollers 32 and 33 and the discharge rollers 36 and 42, due to the provision of the heat insulating rollers 51 and 52.

According to this modification, since the leakage amount of the heated air through the inlet 56a is decreased, a temperature increase of the feed rollers 32 and 33 is lessened. It is thus possible to prevent the formation of bubbles due to the boiling of the thermally molten substances on the developer paper 17 heated on the paper feed side, to ensure the high quality of the image. Furthermore, since the distance between the discharge side roller 52 and the guide plate 50 is larger than that on the paper feed side, it is possible to eliminate a fear that the paper jam would occur.

A modification of the sheet heating unit 23 according to the invention will now be described in more detail with reference to FIGS. 7 to 10.

As shown in FIGS. 7 to 10, the sheet heating unit 23 has a guide plate 50 for defining a feed path of the developer paper 17, side walls 132 (one of which is shown) extending along the feed path, and a cover 56 for covering an upper portion of the guide plate 50. A cover member 130 is composed of the cover 56, the guide plate, 50 and the opposite side walls 132. Also, an inlet 56a in the feeding side of the developer paper 17 and an outlet 56b for discharging the developer paper 17 are formed between the guide plate 50 and the cover 56.

A pair of feed rollers 32 and 33 and a pair of discharge rollers 36 and 42 are provided about axes, perpendicular to the feed path, in the vicinity of both ends of the guide plates 50. A Nichrome wire 59 for forming a heating means is arranged to be covered by the cover member 130. A cross-flow fan 60 is provided to be rotatable about an axis perpendicular to the feed path. Air around the Nichrome wire 59 is heated by the Nichrome wire 59, and the air within the cover member 130 is recirculated in the direction indicated by the arrows by the rotation of the fan 60 as shown in FIG. 7.

A pair of shutter members 140 and 141 for opening/closing the inlet 56a and 56b, respectively, are provided to be movable up and down between the opposite side walls 32. Electromagnetic solenoids 142 and 143 for forming drive means are connected to the shutter members 140 and 141, respectively. In response to the operation of the electromagnetic solenoids 142 and 143, the respective shutter members 140 and 141 are switched over to a closed position shown by the solid line in FIG. 7 and a open position indicated by the dashed line in FIG. 7. A detector 144 for detecting a leading end and a trailing end (on the feed side end and the discharge end) of the developer paper 17 passing on the guide plate 50 is provided close to the paper feed rollers 32 and 33.

Figure 7:
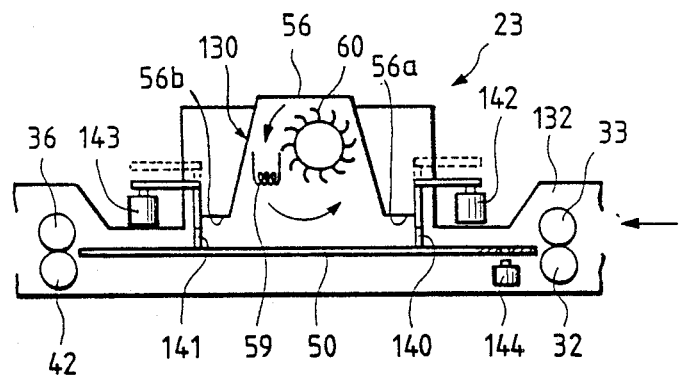
FIGS. 7 to 10 are views showing the operational conditions of a heating device according to a modification of the present invention.

In the thus constructed sheet heating unit 23, prior to feeding the developer paper 17 to the sheet heating unit 23, the respective shutter members 140 and 141 close the opening, i.e., inlet and outlet 56a and 56b in accordance with the action of the solenoids 142 and 143 as shown in FIG. 7. In this condition, currents are supplied to the Nichrome wire 59, and the fan 60 is operated so that the heated air is recirculated within the cover member 130.

Figure 8:
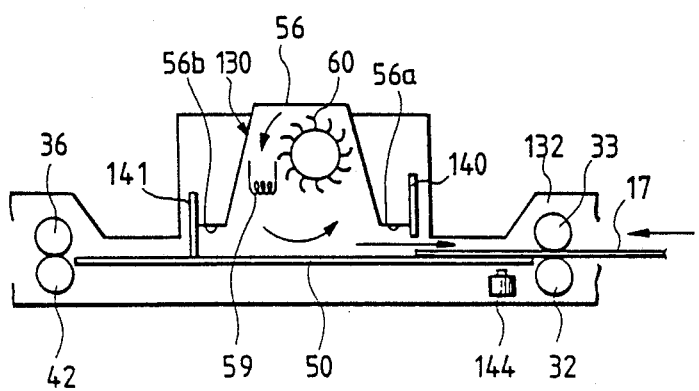

Under this condition, when the developer paper 17 is led into the cover member 130 in accordance with the rotation of the feed rollers 32 and 33, the leading end of the developer paper 17 is detected by the detector 144. When the developer paper is fed by a predetermined amount after the detection and the leading end thereof is brought into contact with the inlet side shutter member 140, the shutter member 140 is moved to the open position to open the inlet 56a by the action of the inlet side solenoid 142 as shown in FIG. 8. Then, the leading end of the developer paper 17 is delivered into the cover member 130 through the inlet 56a.

Figure 9:
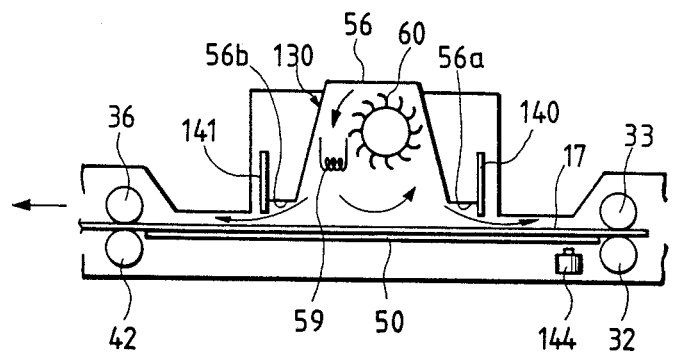

After the switching-over of the inlet side shutter member 140 to the open position, the developer paper 17 is delivered by a predetermined amount so that the leading edge thereof is close to the outlet side shutter member 141. At this time, the shutter member 141 is moved to the open position by the action of the outlet side solenoid 143, to open the outlet 56b. Then, the leading edge of the developer paper 17 reaches the outside of the cover member 130 through the outlet 56b, as shown in FIG. 9.

Figure 10:
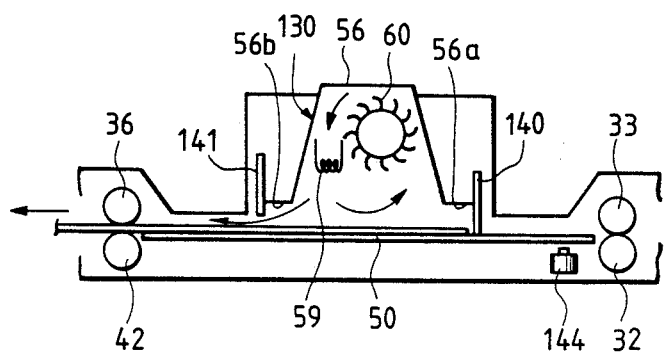

After the detection of the trailing end of the developer paper 17 by the detector 144, the developer paper is delivered by a predetermined amount, so that the trailing end of the developer paper 17 has passed through the inlet 56a and is separated away from the inlet shutter member 140 as shown in FIG. 10. At this time, the shutter member 140 is switched over to the closed position by the action of the electromagnetic solenoid 142 to close the inlet 56a. Subsequently, when the trailing end of the developer paper 17 has passed through the outlet 56b and is separated away from the outlet shutter member 141, the shutter member 141 is switched over to the closed position by the action of the solenoid 143 to close the outlet 56b. The approach and separation of the end portions of the developer paper 17 are detected by the feed amount of the developer paper 17 after the detection of the developer paper 17 by the detector 144

As described above, during the passage of the developer paper 17 through the cover member 130, the developer paper 17 is heated by the heated air to thereby thermally fix the image thereon. In this modification, only when the developer paper 17 passes through the inlet 56a or the outlet 56b, is the shutter member 140 or 141 opened respectively. It is thus possible to reduce the heat quantity dispersed from the inlet 56a or the outlet 56b to the outside. Accordingly, there is no fear that equipments arranged around the copying machine would be excessively heated in addition to the advantage that the heat loss within the sheet heating unit 23 is reduced to thereby effectively perform the heat treatment. Also, it is possible to reduce the manufacture cost by using a Nichrome wire that is inexpensive and has a small heating capacity.

Also, the invention is not limited to the foregoing embodiment. For instance, it is possible to use a cam that is rotated by a motor, as the drive means for the shutter members. Also, a hydraulic cylinder or a pneumatic cylinder may be used as the drive means. Also, it is possible to use a transparent plastic film usable for an overhead projector as the developer paper. It is apparent that the invention is applied to the monochromatic copying machine According to the present invention, it is possible to reduce a heat loss to perform an effective heat treatment and there is no fear that the equipments around the copying machine would be excessively heated.

We claim:

1. A sheet heating device comprising:
   a guide plate on which a sheet slidingly travels, the guide plate being stationarily maintained and having upstream and downstream ends;
   a sheet feeding means provided at the upstream end of the guide plate for feeding the sheet onto the guide plate, the sheet feeding means comprising a first pair of rollers;
   a sheet discharge means provided at the downstream end of the guide plate for discharging teh sheet therefrom, the sheet discharge means comprising a second pair of rollers;
   heating means for heating the sheet on the guide plate; and
   at least one heat insulating member provided at one of a position between the heating means and the sheet feeding means and a position between the heating means and teh sheet discharge means for preventing a temperature increase of at least one of the sheet feeding means and teh sheet discharge means.

2. The sheet heating device according to claim 1, wherein teh heat insulating member is provided between teh heating means and the first pair of rollers.

3. The sheet heating device according to claim 2, wherein the heat insulating means comprises a heat insulating roller, and wherein the heat insulating roller has an outer surface formed of foamed material.

4. The sheet heating device according to claim 1, wherein the heat insulating member is provided between the heating means and the second pair of rollers.

5. The sheet heating device according to claim 4, wherein the heat insulating means comprises a heat insulating roller, and wherein the heat insulating roller has an outer surface formed of foamed material.

6. The sheet heating device according to claim 1, wherein the said at least one heat insulating member comprises first and second heat insulating rollers, the first heat insulating roller being positioned between the heating means and the sheet feeding means and the second heat insulating roller being positioned between the heating means and the sheet discharge means, the sheet being traveled between the guide plate and heat insulating rollers, a distance between the second heat insulating roller and the sheet being larger than a distance between the first heat insulating roller and the sheet.

7. The sheet heating device according to claim 1, further comprising a cover member for covering the heating means and disposed over the guide plate, the cover member being formed with a first opening opening on a feed side of the sheet and a second opening opening on a discharge side of the sheet, and wherein the heat insulating means comprises first and second shutter members for selectively opening and closing the first and second openings.

8. A sheet heating device comprising:
   a delivery means for delivering a piece of sheet, said delivery means including a stationary guide plate having an upstream side and a downstream side; a first delivery means located on the upstream side and a second delivery means located on the downstream side, the guide plate defining a sheet delivery path;
   a heating means for heating the sheet on said delivery path;
   a heat insulating means for preventing a temperature increase of said delivery means due to heat of said heating means; and a covering means for substantially hermetically covering said heating means in cooperation with said heat insulating means, the first and second delivery means each comprising a pair of rollers and being positioned outside of the covering means.

9. The sheet heating device according to claim 8, wherein said heat insulating means includes a first heat insulating member for heat insulating said first delivery means.

10. The sheet heating device according to claim 9, wherein said heat insulating means includes a second heat insulating member for heat insulating said second delivery means.

11. The sheet heating device according to claim 10, wherein said first heat insulating member is a roller.

12. The sheet heating device according to claim 10, wherein said second insulating member comprises a second movable shutter.

13. The sheet heating device according to claim 10, wherein said second delivery means includes a roller made of foamed material.

14. The sheet heating device according to claim 9, wherein said first insulating member comprises a first movable shutter.

15. The sheet heating device according to claim 9, wherein said first heat insulating member is a roller. wherein said second delivery means includes a roller made of foamed material.

16. The sheet heating device according to claim 8, wherein teh heating means comprises a heater element for heating air within the covering means and a fan for recirculating the air.

17. A sheet heating device comprising:
a delivery means for delivering a piece of sheet, said delivery means including a first delivery means located on an upstream side and a second delivery means located on a downstream side for defining a delivery path of said sheet, and a guide plate;
a heating means for heating the sheet on said delivery path;
a heat insulating means for preventing a temperature increase of said delivery means due to heat of said heating means, said heat insulating means including a first heat insulating member for heating insulating said first delivery means and a second heat insulating member for heat insulating said second delivery means wherein a distance between said first heat insulating member and said guide plate is smaller than a distance between said second heat insulating member and said guide plate; and
a covering means for substantially hermetically covering said heating means in cooperation with said heat insulating means.

18. A sheet heating device comprising:
a guide plate on which a sheet travels, the guide plate having upstream and downstream ends;
a sheet feeding means provided at the upstream end of the guide plate for feeding the sheet onto the guide plate;
a sheet discharge means provided at the downstream end of the guide plate for discharging the sheet therefrom;
heating means for heating the sheet on the guide plate; and
a heat insulating means further comprising first and second heat insulating rollers, the first heat insulating roller being positioned between teh heating means and the sheet feeding means and the second heat insulating roller being positioned between teh heating means and the sheet discharge means such that each heat insulating roller prevents a temperature increase of one of the sheet feeding means and the sheet discharge means wherein when teh sheet passes between the guide plate and heat insulating rollers, a distance between teh second heat insulating roller and the sheet is larger than a distance between the first heat insulating roller and the sheet.

* * * * *